United States Patent
Zhao et al.

(10) Patent No.: US 11,871,669 B2
(45) Date of Patent: Jan. 9, 2024

(54) THERMOELECTRIC POWER GENERATION STRUCTURE AND TEMPERATURE MEASURING SENSOR

(71) Applicant: ShenZhen AFU Intelligent Internet Technology Co., Ltd., Shenzhen (CN)

(72) Inventors: Zhenhe Zhao, Shenzhen (CN); Zongliang Song, Shenzhen (CN)

(73) Assignee: ShenZhen AFU Intelligent Internet Technology Co., Ltd., Shenzhen (CN)

( * ) Notice: Subject to any disclaimer, the term of this patent is extended or adjusted under 35 U.S.C. 154(b) by 331 days.

(21) Appl. No.: 17/350,997

(22) Filed: Jun. 17, 2021

(65) Prior Publication Data

US 2022/0344560 A1 Oct. 27, 2022

(30) Foreign Application Priority Data

Apr. 23, 2021 (CN) .......................... 202110445522.2

(51) Int. Cl.
*G01K 7/00* (2006.01)
*H10N 10/17* (2023.01)
(Continued)

(52) U.S. Cl.
CPC ............ *H10N 10/17* (2023.02); *G01K 7/04* (2013.01); *G01K 7/16* (2013.01); *G01K 2207/02* (2013.01)

(58) Field of Classification Search
CPC ............ H01N 10/17; G01K 7/04; G01K 7/16; G01K 2207/02
See application file for complete search history.

(56) References Cited

U.S. PATENT DOCUMENTS

| | | | | |
|---|---|---|---|---|
| 5,409,547 A | * | 4/1995 | Watanabe | H10N 10/13 136/224 |
| 5,931,580 A | * | 8/1999 | Wyland | G01K 7/01 374/166 |

(Continued)

FOREIGN PATENT DOCUMENTS

| | | | | |
|---|---|---|---|---|
| CA | 2650855 A1 | * | 11/2007 | ............. H01L 35/30 |
| CN | 104917272 A | * | 9/2015 | ............. G04G 21/00 |

(Continued)

OTHER PUBLICATIONS

17350997_2023-09-11_CA_2650855_A1_H.pdf, Nov. 2007.*
17350997_2023-09-11_CN_210349878_U_H.pdf, Apr. 2020.*

*Primary Examiner* — Gail Kaplan Verbitsky
(74) *Attorney, Agent, or Firm* — Westbridge IP LLC

(57) ABSTRACT

This application discloses a thermoelectric power generation structure and a temperature measuring sensor. The thermoelectric power generation structure includes: a semiconductor power generation element, a first thermal-conductive element arranged in a first environment and connected to an inner side face of the semiconductor power generation element, and a second thermal-conductive element connected to an outer side face of the semiconductor power generation element. When there is a temperature difference between the first environment and the second environment, the semiconductor power generation element generates electric power. This application solves the technical problem that the thermoelectric power generation structure cannot match a sensor probe and fails to create a thermoelectric power generation environment, and accordingly cannot effectively generate electric power to the sensor probe in an enclosed high-temperature food heating scene.

9 Claims, 2 Drawing Sheets

(51) Int. Cl.
  *G01K 7/04*       (2006.01)
  *G01K 7/16*       (2006.01)

(56) References Cited

U.S. PATENT DOCUMENTS

| | | | | |
|---|---|---|---|---|
| 6,288,321 B1 | * | 9/2001 | Fleurial | H10N 10/852 |
| | | | | 136/238 |
| 2006/0076046 A1 | * | 4/2006 | Ghoshal | H10N 19/00 |
| | | | | 257/E27.008 |
| 2006/0243317 A1 | * | 11/2006 | Venkatasubramanian | |
| | | | | H10N 10/13 |
| | | | | 136/206 |
| 2008/0283110 A1 | * | 11/2008 | Jin | H10N 10/17 |
| | | | | 136/206 |
| 2015/0204733 A1 | * | 7/2015 | Newell | G01K 7/16 |
| | | | | 374/141 |
| 2020/0136005 A1 | * | 4/2020 | Sun | H10N 10/01 |
| 2021/0223111 A1 | * | 7/2021 | Landsecker | G01K 1/024 |

FOREIGN PATENT DOCUMENTS

| | | | | | |
|---|---|---|---|---|---|
| CN | 206774070 U | * | 12/2017 | | |
| CN | 210349878 U | * | 4/2020 | | |
| JP | 4300637 B2 | * | 7/2009 | | |
| KR | 20020019786 A | * | 3/2002 | | |
| WO | WO-2020089620 A1 | * | 5/2020 | | H01L 35/02 |

* cited by examiner

THERMOELECTRIC POWER GENERATION STRUCTURE AND TEMPERATURE MEASURING SENSOR

CROSS-REFERENCE TO RELATED APPLICATIONS

This application is a Non-Provisional Application which claims priority to Chinese Application No. 2021104455222 filed Apr. 23, 2021 entitled "THERMOELECTRIC POWER, GENERATION STRUCTURE AND TEMPERATURE MEASURING SENSOR", which is incorporated herein by reference in its entirety.

TECHNICAL FIELD

This application relates to the field of sensors, in particular to a thermoelectric power generation structure and a temperature measuring sensor.

BACKGROUND

Smooth thermoelectric power generation can be achieved by ensuring a temperature difference between one side and the other side of a semiconductor heating element. It is conceivable of heating or cooling one side, or heating one side while cooling the other side, or placing one side in a cold environment while placing the other side in a thermal environment.

The inventor has found that when a thermoelectric power generation structure is used with a sensor probe for measuring an internal temperature, a difficulty in power on of the sensor probe in an enclosed high-temperature food heating scene may be effectively overcome. However, the thermoelectric power generation structure cannot match the sensor probe in such a scene and fails to create a thermoelectric power generation environment in the scene, resulting in a difficulty in power generation.

For the problem that the thermoelectric power generation structure cannot match the sensor probe and fails to create the thermoelectric power generation environment, and accordingly cannot effectively generate electric power to the sensor probe in the enclosed high-temperature food heating scene, no effective solutions have yet been proposed.

SUMMARY

This application is substantially intended to provide a thermoelectric power generation structure and a temperature measuring sensor, for solving the problem that the thermoelectric power generation structure cannot match a sensor probe and fails to create a thermoelectric power generation environment, and accordingly cannot effectively generate electric power to the sensor probe in an enclosed high-temperature food heating scene.

In order to achieve the above objective, according to an aspect of this application, a thermoelectric power generation structure is provided.

The thermoelectric power generation structure according to this application includes: a semiconductor power generation element, a first thermal-conductive element arranged in a first environment and connected to an inner side face of the semiconductor power generation element, and a second thermal-conductive element connected to an outer side face of the semiconductor power generation element. When there is a temperature difference between the first environment and the second environment, the semiconductor power generation element generates electric power.

Further, the semiconductor power generation element includes a semiconductor power generation piece and a booster circuit electrically connected to the semiconductor power generation piece.

Further, the first thermal-conductive element is a thermal-conductive copper bar.

Further, the second thermal-conductive element is a heat-collection aluminum sheet.

Further, heat-insulation silicone sleeves are arranged on the first thermal-conductive element and the lateral side of the semiconductor power generation element.

In order to achieve the above objective, according to another aspect of this application, a temperature measuring sensor is provided.

The temperature measuring sensor according to this application includes: any thermoelectric power generation structures described above, and a temperature probe electrically connected to an output end of the thermoelectric power generation structure. A lower portion of the temperature probe is used to be inserted in an internal environment of food under heating, and an upper portion of the temperature measuring probe is used for exposing in a heating environment.

Further, the temperature probe includes a casing, a circuit board arranged in the casing, and an internal Negative Temperature Coefficient (NTC) sensor and an external NTC sensor respectively electrically connected to the circuit board; the internal NTC sensor is arranged at a position close to the bottom of the casing, and the external NTC sensor is arranged outside the top of the casing; and the circuit board controls the internal NTC sensor and the external NTC sensor according to control instructions.

Further, the casing includes a metal needle-shaped casing arranged on the lower portion of the temperature probe and a waterproof plastic casing arranged on the upper portion of the temperature probe, and the metal needle-shaped casing is connected to the waterproof plastic casing.

Further, the temperature probe also includes a wireless communication component electrically connected to an output end of the thermoelectric power generation structure; the wireless communication component is electrically connected to the circuit board and configured to transmit the received control instructions to the circuit board; and the wireless communication component is arranged in the waterproof plastic casing.

Further, the temperature measuring sensor also includes a super capacitor electrically connected to the temperature probe and arranged in a position close to the bottom of the metal needle-shaped casing.

In embodiments of this application, a thermoelectric power generation mode is adopted. The thermoelectric power generation structure includes: a semiconductor power generation element, a first thermal-conductive element arranged in a first environment and connected to an inner side face of the semiconductor power generation element, and a second thermal-conductive element connected to an outer side face of the semiconductor power generation element. When there is a temperature difference between the first environment and the second environment, the semiconductor power generation element generates electric power. Thus, the purpose that the structure matches the sensor probe and can create an environment required for thermoelectric power generation is achieved, thereby achieving a technical effect of effectively generating power to the sensor probe, and solving the technical problem that the thermoelectric power generation structure cannot match the sensor probe and fails to create the thermoelectric power generation environment, and accordingly cannot effectively generate electric power to the sensor probe in the enclosed high-temperature food heating scene.

BRIEF DESCRIPTION OF THE DRAWINGS

The accompanying drawings constituting a part of this application are used to provide a further understanding of this application, so that other features, objectives, and advantages of this application become more apparent. The schematic drawings and descriptions thereof in the embodiments of this application are intended to explain this application, and do not constitute an improper limitation on this application. In the drawings.

Figure 1:
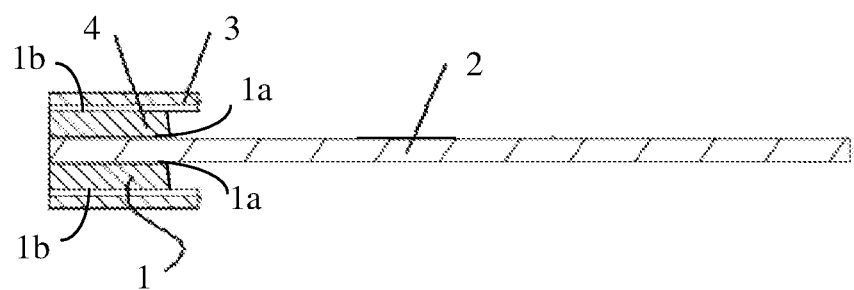
FIG. 1 is a schematic structural diagram of a thermoelectric power generation structure according to an embodiment of this application.
Figure 2:
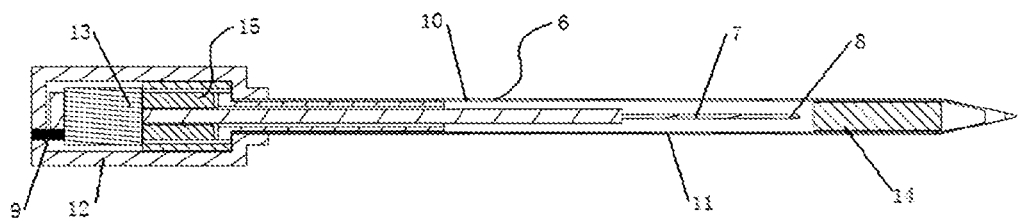
FIG. 2 is a first schematic structural diagram of a temperature measuring sensor according to an embodiment of this application.
Figure 3:
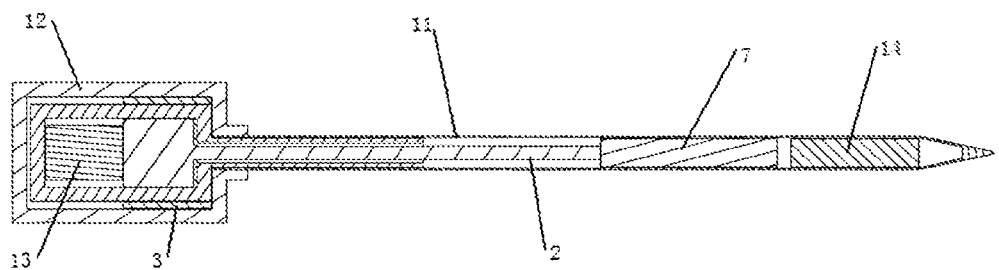
FIG. 3 is a second schematic structure diagram of the temperature measuring sensor according to the embodiment of this application.
Figure 4:
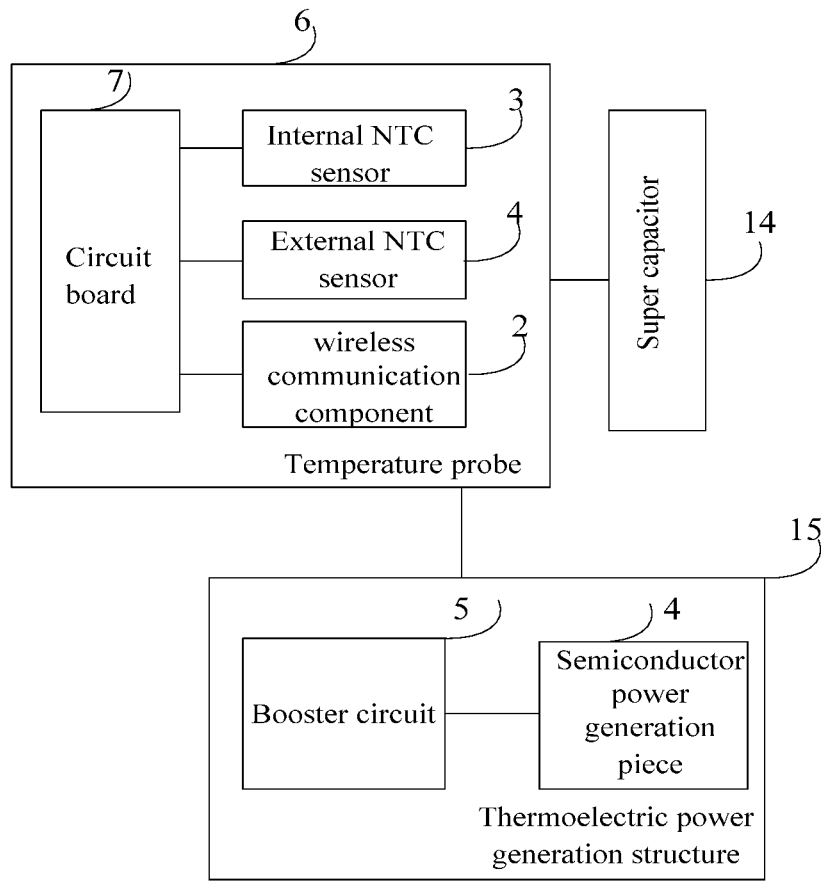
FIG. 4 is a connection schematic diagram of the temperature measuring sensor according to the embodiment of this application.

REFERENCE SIGNS 1, semiconductor power generation element; 1a, inner side face of the semiconductor power generation element; 1b, outer side face of the semiconductor power generation element; 2, first thermal-conductive element; 3, second thermal-conductive element; 4, semiconductor power generation piece; 5, booster circuit; 6, temperature probe; 7, circuit board; 8, internal NTC sensor; 9, external NTC sensor; 10, casing; 11, metal needle-shaped casing; 12, waterproof plastic casing; 13, wireless communication component; 14, super capacitor; and 15, thermoelectric power generation structure.

DETAILED DESCRIPTION OF THE EMBODIMENTS

In order to make the solutions of this application better understood by those skilled in the art, the technical solutions in the embodiments of this application will be clearly and completely described below in combination with the drawings in the embodiments of this application. Obviously, the described embodiments are not all embodiments but part of embodiments of this application. All other embodiments obtained by those of ordinary skill in the art on the basis of the embodiments in this application without creative work shall fall within the scope of protection of this application.

It should be noted that the terms "first", "second", and the like in the specification and claims of this application and in the above drawings are used to distinguish similar objects and are not necessarily used to describe a specific sequence or order. It will be appreciated that the data used in this way may be interchanged where appropriate, so that the embodiments of this application described herein may be implemented. For example, terms "include", "have" and any variations thereof are intended to cover non-exclusive inclusion, for example, a process, method, system, product or device including a series of operations or units is not necessary to be limited to the operations or units which are listed, but may include operations or units which are not clearly listed or other units or operations intrinsic to the process, the method, the product or the device.

In this application, orientation or position relationships indicated by terms "upper", "lower", "left", "right", "front", "back", "top", "bottom", "inner", "outer", "middle", "vertical", "horizontal", "transverse", "longitudinal" and the like are orientation or position relationships shown in the drawings. These terms are adopted not to limit that indicated devices or components must be in specific orientations or structured and operated in specific orientations but only to conveniently describe this application and the embodiments thereof.

In addition, part of the above terms may be adopted to indicate other meanings in addition to the orientation or position relationships. For example, the term "upper" may be adopted to indicate a certain attachment relationship or connection relationship in some cases. Those of ordinary skill in the art can understand specific implications of the above terms in this application according to specific situations.

In addition, terms "mount", "set", "provided with", "connect", "mutually connect", "socket joint" and the like should be broadly understood. For example, the terms may refer to fixed connection, detachable connection, or integration. The terms may refer to mechanical connection or electrical connection. The terms may also refer to direct connection, or indirect connection through a medium, or communication in two devices, or elements or components. Those of ordinary skill in the art can understand specific implications of the above terms in this application according to specific situations.

It is to be noted that the embodiments in this application and the features in the embodiments may be combined under the condition of no conflicts. This application is described below with reference to the drawings and in conjunction with the embodiments in detail.

Figure 5:
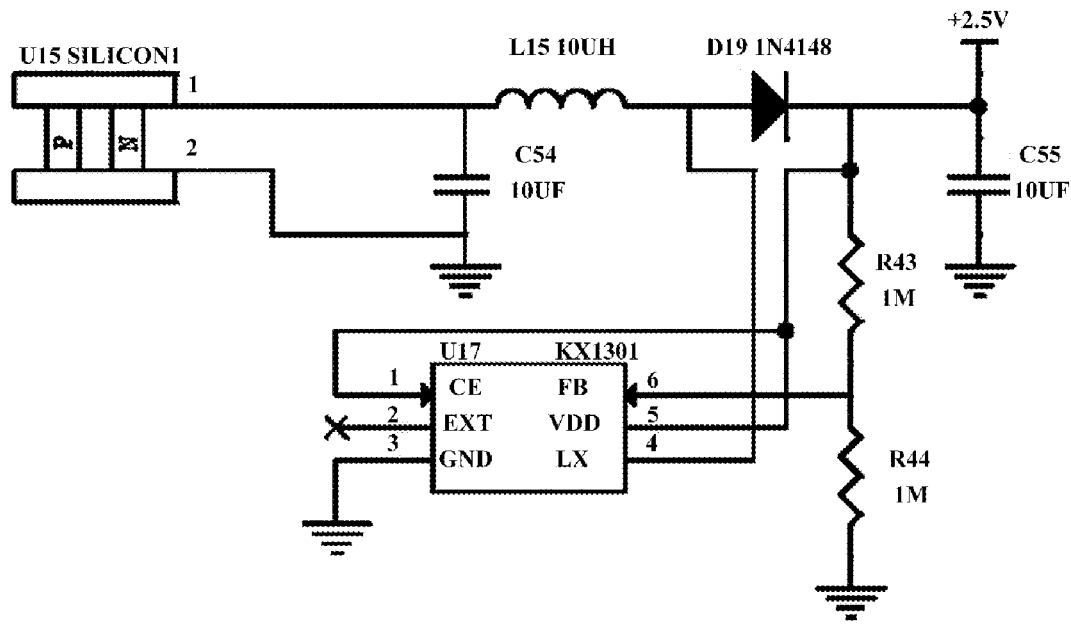
FIG. 5 is a schematic circuit diagram of a semiconductor power generation element according an embodiment of this application.

As shown in FIG. 1 and FIG. 5, this application relates to a thermoelectric power generation structure, including a semiconductor power generation element, a first thermal-conductive element arranged in a first environment and connected to an inner side face of the semiconductor power generation element, and a second thermal-conductive element connected to an outer side face of the semiconductor power generation element. When there is a temperature difference between the first environment and the second environment, the semiconductor power generation element generates electric power.

Specifically, the semiconductor power generation element has a function of generating power when there is a temperature difference between two side faces thereof. In the embodiment, the inner side face of the semiconductor power generation element is arranged in an internal environment of food, particularly roast meat, under heating, that is, a first environment. The outer side face of the semiconductor power generation element is arranged in an external environment of the food under heating, particularly an oven, that is, a second environment. Because the inside of the food is difficult to be heated to a high temperature and the oven for heating is easy to reach a high temperature, the first thermal-conductive element in the embodiment is placed in the roast meat while the second thermal-conductive element is placed in the oven environment during use. Thus, the high temperature of the oven environment and the low temperature of the inside of the roast meat are respectively conducted to the inner side face and the outer side face of the semiconductor power generation element through the first thermal-conductive element and the second thermal-conductive element, to form the temperature difference between the two side faces of the semiconductor power generation element, so that a thermoelectric power generation environment is skillfully created by means of the low temperature of the inside of the roast meat and the high temperature of the oven environment during meat roasting, and electric power can be generated to the temperature probe for measuring the internal temperature of the food. Moreover, those skilled in the art should understand that the temperature probe is of a structure with the needle-shaped casing, which can be conveniently inserted into an object for temperature measurement. In order to match the structure with the probe in an enclosed high-temperature food heating environment, the first thermal-conductive element and the second thermal-conductive element are provided. Since the first thermal-conductive element is required to enter the inside of the food to create the thermoelectric power generation environment, the first thermal-conductive element may be arranged at a corresponding position in the casing, and the second thermal-conductive element may be arranged at a position, touching the external oven environment, of the casing, thus, the structure of the probe itself and even the first thermal-conductive element and the second thermal-conductive element are used effectively. Therefore, through improvement of the structure, the thermoelectric power generation structure matches the probe-type temperature measuring sensor well. Further, the thermoelectric power generation structure may match the probe type temperature measuring sensor through the first thermal-conductive element and the second thermal-conductive element, may skillfully create the thermoelectric power generation environment in the enclosed high-temperature food heating scene, and accordingly can easily generate electric power to the sensor, so that a difficulty in introducing a lead needed by an external power supply in this scene, or a difficulty in power supply due to poor thermostability of the lead in the scene is overcome.

Preferably, the semiconductor power generation element includes a semiconductor power generation piece and a booster circuit electrically connected to the semiconductor power generation piece. A low voltage generated from the semiconductor power generation element cannot be directly provided to a measuring unit of the sensor for work, and thus, the booster circuit is provided for boosting the low voltage generated, so the boosted voltage matches a working voltage of the sensor. Specifically, referring to FIG. 5, U15 represents the semiconductor power generation piece, output pin 1 refers to positive voltage output, and output pin 2 refers to negative voltage. When the temperature difference between the two sides of the power generation piece reaches 50° C., a generating voltage is up to and higher than 300 mV and an output current exceeds 20 mA. Since the generating voltage of the semiconductor power generation element is low, and the quantity of the power generation piece cannot be increased under limitation of the structure, a booster chip special for a chip U17 is adopted for boosting the voltage to meet an overall working voltage about 2.5 V. The characteristic is that a current consumed by the chip itself is very small, and the output voltage and switching pulse characteristics can be automatically adjusted. Due to the fact that the chip U17 cannot directly work under a generating voltage below 300 mV, a working power supply voltage of the chip U17 is connected to a working power supply of 2.5 V. Thus, the super capacitor is charged by means of an external charging circuit to reach a working voltage of 2.5 V, thereby meeting working requirements of the chip U17. The chip U17 generates a switching signal integrally, the signal is output to a driving inductor L15, a pulsed flyback high-voltage is generated at an end, connected to the chip, of the inductor, is rectified by a diode D19, and is filtered by a capacitor C55 to generate a direct-current voltage that is output to an integral circuit, thereby achieving normal boosting work in a low-voltage power generation environment.

After voltage division, resistors R43 and R44 provide comparing voltages for voltage stabilization on the output voltage by means of the chip U17 to maintain the output voltage around 2.5 V, thereby meeting overall working requirements.

Preferably, the first thermal-conductive element is a thermal-conductive copper bar. Copper has excellent thermal conductivity. One side of the thermal-conductive copper bar is connected to the semiconductor power generation element, and the other end may be directly or indirectly arranged in the first environment, and therefore an ambient temperature of the first environment is effectively conducted to the inner side face of the semiconductor power generation element.

Preferably, the second thermal-conductive element is a heat-collection aluminum sheet. Copper has excellent thermal conductivity. When the heat-collection aluminum sheet covers the outer side face of the semiconductor power generation element, the outer side face of the heat-collection aluminum sheet is in direct contact with the second environment, and thus the heat-collection aluminum sheet can absorb and balance heat energy in the second environment and uniformly distribute the heat to a heat absorbing face of the power generation element.

Preferably, heat-insulation silicone sleeves are arranged on the first thermal-conductive element and the lateral side of the semiconductor power generation element. Since the heat-insulation silicone sleeves are added on the copper bar and portions such as the lateral side of the semiconductor power generation piece, heat energy of the ambient temperature in a part of space exposed to the roast meat is prevented from being directly conducted to the thermal-conductive copper bar, and accordingly influences to power generation efficiency and temperature measurement precision are avoided.

From the above descriptions, it can be seen that this application achieves the following technical effects.

In the embodiments of this application, a thermoelectric power generation mode is adopted. The thermoelectric power generation structure includes: a semiconductor power generation element, a first thermal-conductive element arranged in a first environment and connected to an inner side face of the semiconductor power generation element, and a second thermal-conductive element connected to an outer side face of the semiconductor power generation element; when there is a temperature difference between the first environment and the second environment, the semiconductor power generation element generates electric power. Thus, the purpose that the structure matches the sensor probe and can create an environment required for thermoelectric power generation is achieved, thereby achieving a technical effect of effectively generating power to the sensor probe, and solving the technical problem that the thermoelectric power generation structure cannot match a sensor probe and fails to create a thermoelectric power generation environment, and accordingly cannot effectively generate electric power to the sensor probe in an enclosed high-temperature food heating scene.

As shown in FIGS. 2-5, this application relates to temperature measuring sensor, including: the thermoelectric power generation structure, and a temperature probe electrically connected to an output end of the thermoelectric power generation structure. A lower portion of the temperature probe is used to be inserted in an internal environment of food under heating, and an upper portion of the temperature measuring probe is used for exposing in a heating environment.

Specifically, after the probe type temperature measuring sensor is inserted in the food under heating, the sensor itself is placed in an enclosed high-temperature scene such as an oven or a roaster. Power on of the sensor when the sensor is out of power is a problem difficult to solve. A battery may be built in the sensor directly, but battery power will be eventually exhausted. After the battery power is exhausted, it is difficult to replace the battery if the sensor is still placed in the food under heating, and stopping heating first is needed, which will take a lot of time. Or, a high-temperature-resistant connecting wire may be directly introduced, may be drawn out of a through hole formed on a metal shield of the enclosed oven, roaster, or the like, and then connected to an external power supply to supply power to the sensor, which is difficult in connection. The thermoelectric power generation structure in the embodiments of this application is adopted, and the first thermal-conductive element and the second thermal-conductive element added can match the probe type temperature measuring sensor. Moreover, the lower portion of the temperature probe provided with the first thermal-conductive element may be inserted in the roast meat while the upper portion of the temperature probe provided with the second thermal-conductive element is exposed in a heating environment of the oven, so that the thermoelectric power generation environment is created for generating power to the sensor to measure internal temperature of the roast meat. Thus, needs of replacing the battery, configuring the high-temperature-resistant lead, or penetrating the oven are omitted, thereby greatly improving convenience in power supply.

Preferably, the temperature probe includes a casing, a circuit board arranged in the casing, and an internal Negative Temperature Coefficient (NTC) sensor and an external NTC sensor respectively electrically connected to the circuit board; the internal NTC sensor is arranged at a position close to the bottom of the casing, and the external NTC sensor is arranged outside the top of the casing; and the circuit board controls the internal NTC sensor and the external NTC sensor according to control instructions. A sensor probe made of a common material cannot to be adaptive to a high temperature of the oven environment. In an enclosed high-temperature food heating scene, requirements on high temperature resistance of the sensor are higher. For this reason, a casing made of a heat-resistant material is arranged on the outside of each sensor uniformly, so that the high temperature resistance is or above 300° C., the sensor can be fully adaptive to a maximum temperature of the device such as the oven and the roaster, thereby ensuring that the sensor can work normally in a high-temperature scene. Obviously, the circuit board has low temperature resistance capacity, and can be prevented from being burnt out when uniformly arranged in the casing. It is to be noted that, the internal NTC sensor and the external NTC sensor are both arranged outside the probe, and the difference lies in that one of the sensors is arranged at the bottom and the other one is arranged at the top, the internal NTC sensor at the bottom is inserted in the roast meat, which can measure an internal temperature of the roast meat effectively, and the external NTC sensor at the top is exposed in an external oven environment, which may measure an internal temperature of the oven. At least a single-chip microcomputer is integrated on the circuit board. In the embodiment, a work cycle of each sensor may be set in the single-chip microcomputer, or temperature measurement may be carried out in real time, or the internal NTC sensor and the external NTC sensor are controlled to perform temperature measurement only when receiving an external control signal.

Preferably, the casing includes a metal needle-shaped casing arranged on the lower portion of the temperature probe and a waterproof plastic casing arranged on the upper portion of the temperature probe, and the metal needle-shaped casing is connected to the waterproof plastic casing. Both the metal-needle shaped casing and the waterproof plastic casing are configured to protect the circuit board and internal devices, to prevent mechanical damages and perform waterproof treatment. The metal-needle shaped casing is preferably made of a stainless steel material and designed of a needle structure.

Preferably, the temperature probe also includes a wireless communication component electrically connected to an output end of the thermoelectric power generation structure; the wireless communication component is electrically connected to the circuit board and configured to transmit the control instructions received to the circuit board; and the wireless communication component is arranged in the waterproof plastic casing. The wireless communication component may receive the external control instructions, or may send measured temperature data to the external, thereby implementing communication. In the embodiment, Bluetooth, WiFi, or other communication manners may be adopted. Electric power required for working of the wireless communication component is also provided by the thermoelectric power generation structure.

Preferably, the temperature measuring sensor also includes a super capacitor electrically connected to the temperature probe and arranged in a position close to the bottom of the metal needle-shaped casing. The super capacitor may be charged in advance by means of an external charging circuit, so that a voltage for driving the booster chip to work may be provided when the booster circuit is needed to boost voltage. After charging, overall working electric power is maintained and stably maintained until the thermoelectric power generation structure starts to work to supplement the electric power. After normal generation of the thermoelectric power generation structure, generated electric power may be stored by means of the super capacitor.

This application further relates to an oven, including an oven body, and a plurality of temperature measuring sensors arranged in the oven body.

The above are only the preferred embodiments of this application and not intended to limit this application. For those skilled in the art, this application can have various modifications and variations. Any modifications, equivalent replacements, improvements and the like within the spirit and principle of this application shall fall within the scope of protection as defined in the appended claims of this application.

What is claimed is:

1. A thermoelectric power generation structure, comprising:
   a semiconductor power generation element;
   a first thermal-conductive element arranged in a first environment and connected to an inner side face of the semiconductor power generation element; and
   a second thermal-conductive element arranged in a second environment and connected to an outer side face of the semiconductor power generation element;
   when there is a temperature difference between the first environment and the second temperature difference, the semiconductor power generation element generates electric power.

2. The thermoelectric power generation structure according to claim 1, wherein the semiconductor power generation element comprises a semiconductor power generation piece and a booster circuit electrically connected to the semiconductor power generation piece.

3. The thermoelectric power generation structure according to claim 1, wherein the first thermal-conductive element is a thermal-conductive copper bar.

4. The thermoelectric power generation structure according to claim 1, wherein the second thermal-conductive element is a heat-collection aluminium sheet.

5. A temperature measuring sensor, comprising the thermoelectric power generation structure according to claim 1, and a temperature probe electrically connected to an output end of the thermoelectric power generation structure, wherein a lower portion of the temperature probe is used to be inserted in an internal environment of food under heating, and an upper portion of the temperature probe is used for exposing in a heating environment.

6. The temperature measuring sensor according to claim 5, wherein the temperature probe comprises a casing, a circuit board arranged in the casing, and an internal Negative Temperature Coefficient (NTC) sensor and an external NTC sensor respectively electrically connected to the circuit board; the internal NTC sensor is arranged at a position close to the bottom of the casing, and the external NTC sensor is arranged outside the top of the casing; and the circuit board controls the internal NTC sensor and the external NTC sensor according to control instructions.

7. The temperature measuring sensor according to claim 6, wherein the casing comprises a metal needle-shaped casing arranged on the lower portion of the temperature probe and a waterproof plastic casing arranged on the upper portion of the temperature probe, and the metal needle-shaped casing is connected to the waterproof plastic casing.

8. The temperature measuring sensor according to claim 6, wherein the temperature probe further comprises a wireless communication component electrically connected to an output end of the thermoelectric power generation structure; the wireless communication component is electrically connected to the circuit board and configured to transmit the received control instructions to the circuit board; and the wireless communication component is arranged in the waterproof plastic casing.

9. The temperature measuring sensor according to claim 6, further comprising a super capacitor electrically connected to the temperature probe and arranged in a position close to the bottom of the metal needle-shaped casing.

* * * * *